(12) United States Patent
Contreras Guerra et al.

(10) Patent No.: US 12,730,136 B2
(45) Date of Patent: Sep. 8, 2026

(54) APPARATUS, SYSTEM AND METHOD OF PROVIDING A SMART POWERLINE EVENT AND HEALTH MONITORING OF POWER DISTRIBUTION SYSTEMS USING SURGE PROTECTION DEVICES

(71) Applicant: EATON INTELLIGENT POWER LIMITED, Dublin (IE)

(72) Inventors: Narciso Alberto Contreras Guerra, Santo Domingo (DO); Ruben Gamaliel Herrera Ortiz, Santo Domingo Este (DO)

(73) Assignee: EATON INTELLIGENT POWER LIMITED, Dublin (IE)

( * ) Notice: Subject to any disclaimer, the term of this patent is extended or adjusted under 35 U.S.C. 154(b) by 243 days.

(21) Appl. No.: 18/599,379

(22) Filed: Mar. 8, 2024

(65) Prior Publication Data

US 2025/0283924 A1 Sep. 11, 2025

(51) Int. Cl.
*G01R 19/25* (2006.01)
*G01R 31/08* (2020.01)
*H02H 7/26* (2006.01)

(52) U.S. Cl.
CPC ....... *G01R 19/2503* (2013.01); *G01R 31/086* (2013.01); *H02H 7/26* (2013.01)

(58) Field of Classification Search
CPC ..... G01R 19/2503; G01R 31/086; H02H 7/26
USPC ........................................................ 361/91.1
See application file for complete search history.

(56) References Cited

U.S. PATENT DOCUMENTS 10,004,123 B1 * 6/2018 Yang ...................... H05B 47/24
2010/0014205 A1 * 1/2010 Gerlach ................. H02H 9/042 361/111
2020/0011909 A1 * 1/2020 Bickel ................ G01R 19/2513
2021/0373063 A1 * 12/2021 Gundel .................... G06N 5/04

(Continued)

OTHER PUBLICATIONS

M. Wetter, G. Finis, C. Sander and S. Joerres, "Smart IoT Monitoring System for Surge Protective Devices (SPDs)," 2019 11th Asia-Pacific International Conference on Lightning (APL), Hong Kong, China, 2019, pp. 1-5 (Year: 2019).*

(Continued)

*Primary Examiner* — Sreeya Sreevatsa
(74) *Attorney, Agent, or Firm* — Eckert Seamans Cherin & Mellott, LLC

(57) ABSTRACT

A smart powerline event and health monitoring device (SEHM) structured to be disposed in a power distribution system for a building structure located in a utility system is provided. The SEHM includes: a voltage measurement device connected to line conductors and structured to measure changes in line voltages and frequencies; a surge protection device (SPD) connected to the line conductors and the neutral conductor and structured to shunt electrical energy from a voltage surge to the neutral conductor; a controller connected to the voltage measurement device and the SPD and structured to receive the measured changes from the voltage measurement device; and a communication module connected to the controller, the communication module communicatively coupled to a cloud and a mobile user device having an energy monitoring application installed therein, the communication module structured to transmit the data to the cloud in a wireless connection.

19 Claims, 7 Drawing Sheets

(56) References Cited

U.S. PATENT DOCUMENTS

| | | | | |
|---|---|---|---|---|
| 2022/0159808 | A1* | 5/2022 | Bedo | H05B 47/1965 |
| 2022/0319299 | A1* | 10/2022 | Menzel | G08B 29/185 |
| 2023/0223749 | A1* | 7/2023 | Polychronakis | H02H 9/041<br>361/56 |

OTHER PUBLICATIONS

M. Wetter, G. Finis, C. Sander and S. Joerres, "Smart loT Monitoring System for Surge Protective Devices (SPDs)," 2019 11th Asia-Pacific International Conference on Lightning (APL), Hong Kong, China, 2019, pp. 1-5 (Year: 2019).*

* cited by examiner

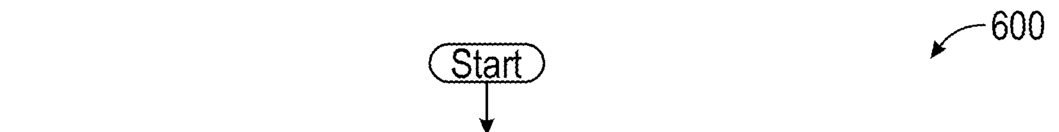

610
Provide a smart powerline event and health monitoring device (SEHM) within a power distribution system, the SEHM including a voltage measurement device connected to line conductors and structured to measure changes in line voltages and frequencies; the SPD connected to the line conductors and the neutral conductor and structured to shunt electrical energy from a voltage surge to the neutral conductor; a controller connected to the voltage measurement device and the SPD and structured to receive the measured changes from the voltage measurement device; and a communication module connected to the controller, the communication module being communicatively coupled to a cloud and a mobile user device having an energy monitoring application installed therein, the communication module being structured to receive the data including the measured changes from the controller and transmit the data to the cloud 620
Measure, by the voltage measurement device, real time changes in line voltages and frequencies and transmit the measured changes to the controller of the SEHM 630
Receive, by the controller, the measured changes from the voltage measurement device and transmit, by the controller, data including the measured changes to the cloud in a wireless connection 640
Receives and analyze, by the cloud, the data based at least in part on historical data including past powerline events, powerline related anomalies or an activity log, determine, by the cloud, if a powerline event oranomaly has occurred or is about to occur based on theanalysis, and transmitby the cloud, a notification to a mobile user device based on the determination via the wireless connection 650
Receive, by the mobile user device, the notification from the cloud 660
Perform a preventative action based on the recommended action

FIG. 6

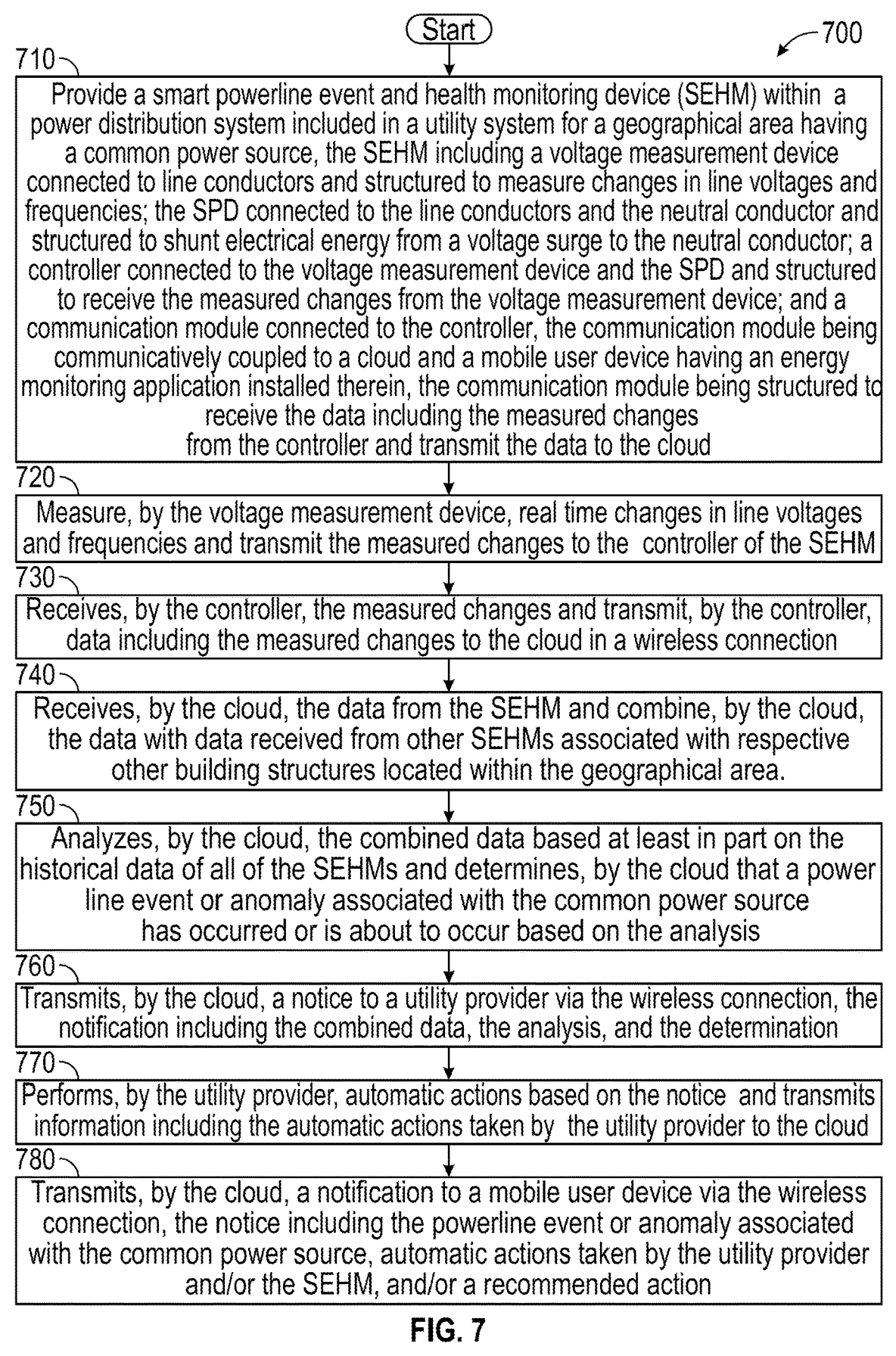

Start

700

710 Provide a smart powerline event and health monitoring device (SEHM) within a power distribution system included in a utility system for a geographical area having a common power source, the SEHM including a voltage measurement device connected to line conductors and structured to measure changes in line voltages and frequencies; the SPD connected to the line conductors and the neutral conductor and structured to shunt electrical energy from a voltage surge to the neutral conductor; a controller connected to the voltage measurement device and the SPD and structured to receive the measured changes from the voltage measurement device; and a communication module connected to the controller, the communication module being communicatively coupled to a cloud and a mobile user device having an energy monitoring application installed therein, the communication module being structured to receive the data including the measured changes from the controller and transmit the data to the cloud 720 Measure, by the voltage measurement device, real time changes in line voltages and frequencies and transmit the measured changes to the controller of the SEHM 730 Receives, by the controller, the measured changes and transmit, by the controller, data including the measured changes to the cloud in a wireless connection 740 Receives, by the cloud, the data from the SEHM and combine, by the cloud, the data with data received from other SEHMs associated with respective other building structures located within the geographical area.

750 Analyzes, by the cloud, the combined data based at least in part on the historical data of all of the SEHMs and determines, by the cloud that a power line event or anomaly associated with the common power source has occurred or is about to occur based on the analysis 760 Transmits, by the cloud, a notice to a utility provider via the wireless connection, the notification including the combined data, the analysis, and the determination 770 Performs, by the utility provider, automatic actions based on the notice and transmits information including the automatic actions taken by the utility provider to the cloud 780 Transmits, by the cloud, a notification to a mobile user device via the wireless connection, the notice including the powerline event or anomaly associated with the common power source, automatic actions taken by the utility provider and/or the SEHM, and/or a recommended action

FIG. 7

APPARATUS, SYSTEM AND METHOD OF PROVIDING A SMART POWERLINE EVENT AND HEALTH MONITORING OF POWER DISTRIBUTION SYSTEMS USING SURGE PROTECTION DEVICES

FIELD OF THE INVENTION

The disclosed concept relates generally to an apparatus, system and method of providing a powerline event and health monitoring of power distribution systems using surge protection devices with remote status communicating capability.

BACKGROUND OF THE INVENTION

Surge protection devices (SPDs) are commonly used to protect electrical and electronic equipment from damage caused by high energy lightning surges and other transient disturbances. These devices include overcurrent protection components such as fuses and temperature coefficient devices (PTCs) or overvoltage protection components such as gas discharge tubes (GDTs), transient voltage suppression (TVS) diodes and metal oxide varistor (MOVs). A GDT may be a ceramic tube sandwiched between metal electrodes and sealed with a rare gas and divert overvoltage to a lower and safer level when an external surge exceeds operating voltage by dissipating plasma gas containing voltage transients. A TVS diode is a clamp device that suppresses all overvoltages above its breakdown voltage by splitting an excess current when the induced voltage exceeds the avalanche breakdown potential. A varistor has a resistance that changes as a function of the voltage that is experienced. At or below a predetermined voltage, the resistance of the varistor is very high. However, the resistance of the varistor drops rapidly in response to voltage above a predetermined threshold. As such, varistors are typically connected between a line conductor and a ground or a neutral conductor and conduct very little current to the ground or neutral conductor when normal voltages, i.e., voltages within a predetermined voltage range, are experienced. However, when the voltage surges outside the predetermined range, the varistors experience reduced resistance and thus shunt electrical power from the voltage surge to the ground or neutral conductor, thereby protecting from destruction a piece of electrical equipment that is connected with the same circuit. One common type of varistor is the metal-oxide varistor (MOV).

An SPD may include circuitry to detect when a surge protection device (e.g., without limitation, MOVs) has failed and is incapable of providing protection. However, currently available SPDs have limited status communicating capabilities due to their dependence on a visual indicator that requires to be inspected by a user to verify their protection status. For example, they operate with an LED that is turned ON, indicating that the SPD is protecting associated circuits and devices and becomes turned OFF at the moment the surge protection is no longer available (e.g., without limitation, damaged MOVs). As such, in order to determine the status of a conventional SPD, the user is required to visit the circuit panel board or load center and physically inspect the status of the LED to review the SPD's status. Such requirement for physical inspection on site for the status of the SPD is not only inconvenient, but also could lead to catastrophic results if the damaged or non-functioning MOVs are not detected in time.

There is room for improvement in surge protection devices in power distribution systems.

SUMMARY OF THE INVENTION

These needs, and others, are met by embodiments of the disclosed concept in which a smart powerline event and health monitoring device (SEHM) structured to be disposed in a power distribution system for a building structure located in a utility system. The SEHM includes: a voltage measurement device connected to line conductors and structured to measure changes in line voltages and frequencies; a surge protection device (SPD) connected to the line conductors and the neutral conductor and structured to shunt electrical energy from a voltage surge to the neutral conductor; a controller connected to the voltage measurement device and the SPD and structured to receive the measured changes from the voltage measurement device; and a communication module connected to the controller, the communication module being communicatively coupled to a cloud and a mobile user device having an energy monitoring application installed therein, the communication module being structured to receive the data including the measured changes from the controller and transmit the data to the cloud in a wireless connection.

Another embodiment provides a utility system including a power source having powerlines; a plurality of building structures each including respective power distribution systems having a smart powerline event and health monitoring device (SEHM) electrically connected to the powerlines and structured to monitor powerline event and health based at least in part on changes in line voltages and frequencies and/or a status of a surge protection device (SPD); a mobile user device including an energy monitoring application installed therein; and a power management service cloud communicatively coupled to the communication module of the SEHM and the mobile user device via a wireless connection. The SEHM includes a voltage measurement device connected to line conductors and structured to measure changes in the line voltages and frequencies, an SPD connected to the line conductors and the neutral conductor and structured to shunt electrical energy from a voltage surge to the neutral conductor, a controller connected to the voltage measurement device and the SPD and structured to receive the measured changes from the voltage measurement device, and a communication module connected to the controller. The communication module is structured to receive the data including the measured changes from the controller and transmit the data to the cloud in a wireless connection.

In yet another embodiment is provided a method of providing smart powerline event and health monitoring in a utility system having a power distribution system associated with respective building structure. The method includes providing a smart powerline event and health monitoring device (SEHM) within a power distribution system, the SEHM including a voltage measurement device electrically connected to line conductors and structured to measure changes in line voltages and frequencies, a surge protection device (SPD) having a SPD status indicator, a controller coupled to the voltage measurement device, the SPD and a communication module and structured to receive the measured changes from the voltage measurement device and transmit data including the measured changes to a cloud communicatively coupled to the communication module, the cloud being structured to receive the data, analyze the measured changes based at least in part on historical data, determine that a powerline event or anomaly has occurred or is about to occur, and transmit a notification to a mobile user device via a wireless connection in response to the determination, the notification including the data, a recommended action and automatic actions that have taken place in response to the determination. The method further includes measuring, by the voltage measurement device, real time changes in line voltages and frequencies and transmitting the measured changes to the controller; receiving and transmitting, by the controller, the measured changes to the cloud; analyzing, by the cloud, the data based at least in part on the historical data; determining, by the cloud, if a powerline event or anomaly has occurred or is about to occur; transmitting, by the cloud, a notification to the mobile user device via the wireless connection; and performing a preventive or remedial action based on the recommended action.

BRIEF DESCRIPTION OF THE DRAWINGS

A full understanding of the invention can be gained from the following description of the preferred embodiments when read in conjunction with the accompanying drawings in which:

FIG. 6 is a flow chart of a method of smart powerline event and health monitoring in a power distribution system accordance with a non-limiting, example embodiment of the disclosed concept; and FIG. 7 is a flow chart for a method of smart powerline event and health monitoring in a power distribution system included in a geographical area having a common power source in accordance with the disclosed concept.

DETAILED DESCRIPTION OF THE INVENTION

Figure 1:
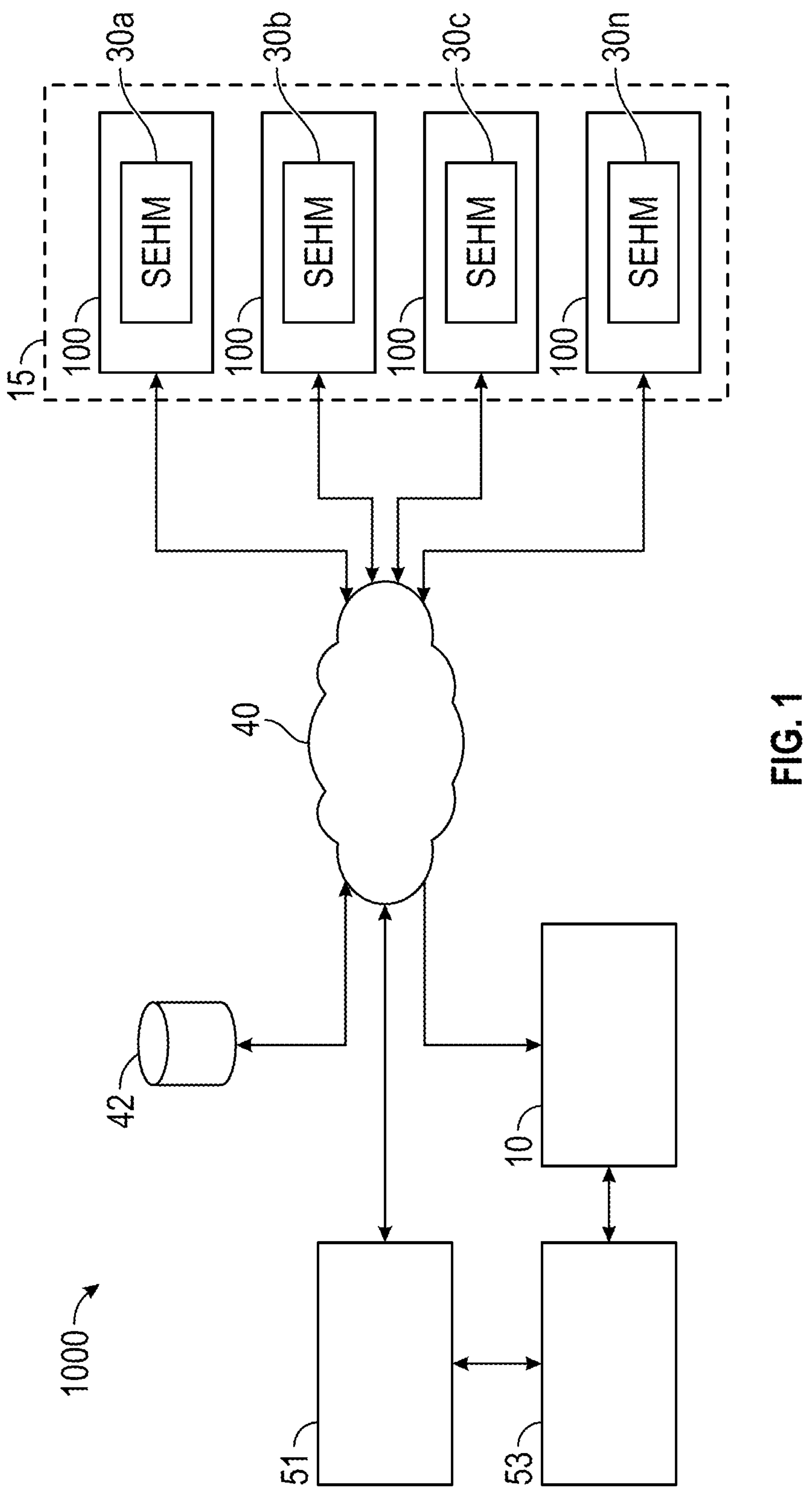
FIG. 1 is a block diagram of a system logic including a utility system including a plurality power distribution systems having exemplary smart powerline event and health monitoring device in accordance with a non-limiting, example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Figure 2:
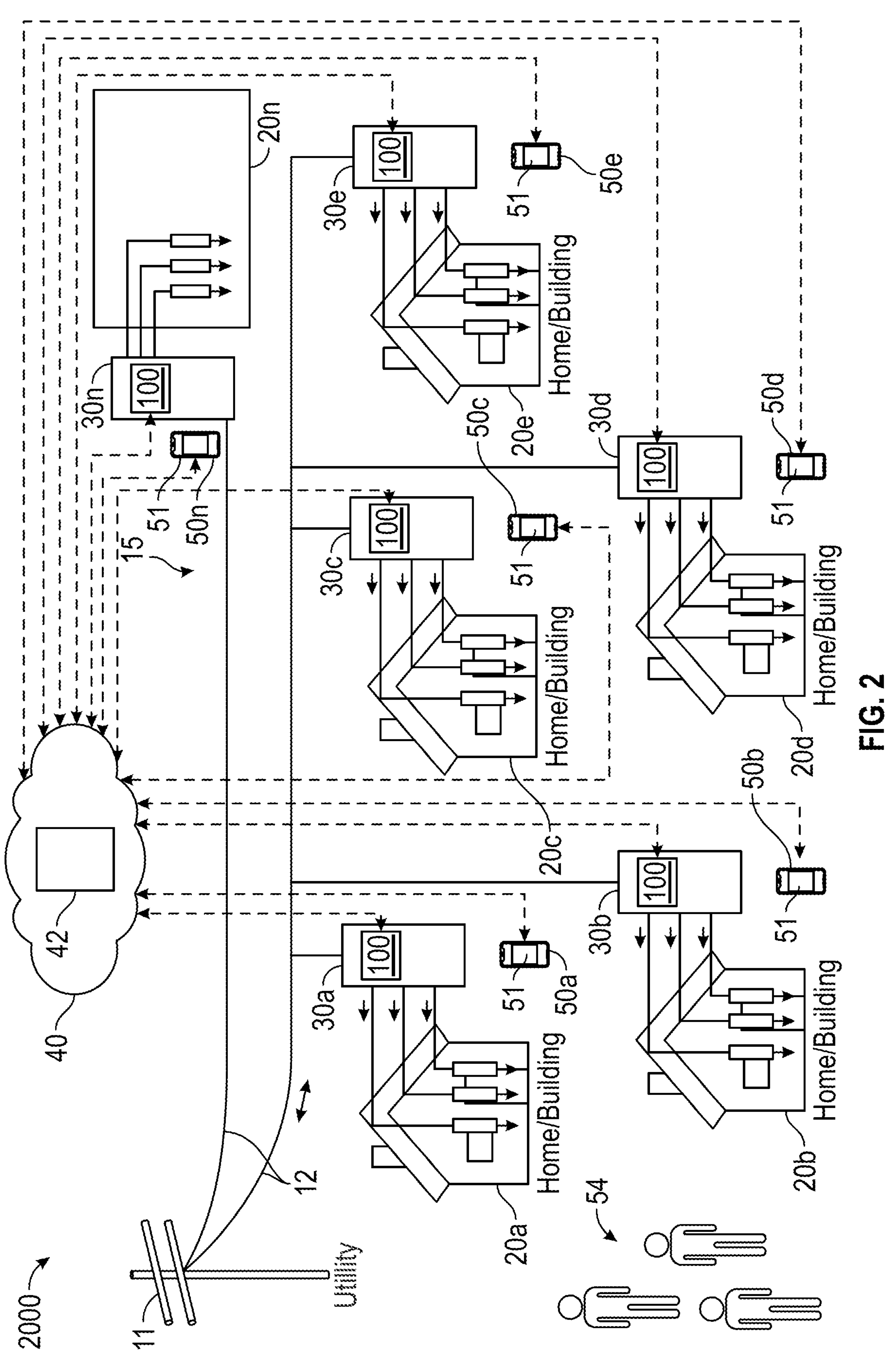
FIG. 2 is a diagram of a utility system including a plurality power distribution systems having exemplary smart powerline event and health monitoring device in accordance with a non-limiting, example embodiment of the disclosed concept.

FIGS. 1-5 illustrate an exemplary smart powerline event and health monitoring device (SEHM) 100 in a power distribution system 30*a-n* in accordance with an example embodiment of the disclosed concept. FIG. 1 is a block diagram of a system logic including a utility system 1000 and FIG. 2 is a more detailed diagram of a utility system 2000 including a plurality of building structures 20*a-n* disposed in a same geographical area 15. The utility system 1000, 2000 includes a utility provider 10, building structures 20*a-n*, power distribution systems 30*a-n*, a power management service cloud 40, and an energy monitoring application 51. The utility provider 10 is communicatively coupled to the cloud 40, and optionally, a certified contractor network 53. The utility provider 10 provides power to the building structures 20*a-n* via a local power source 11 (e.g., without limitation, a transformer) in a geographical area 15 (e.g., without limitation, a neighborhood) and monitors the status of the power source 11. A building structure 20*a-n* may be any building structure, e.g., without limitation, a residential housing, offices, schools, hospitals, etc.) and includes a power distribution system 30*a-n*. The power distribution system 30*a-n* may be, e.g., a load center, a power control center, etc. and connected to the local power source 11 via the powerlines 12. It is also communicatively connected to the power management service cloud 40. The power distribution system 30*a-n* is described further with reference to FIG. 3.

The power management service cloud 40 may be communicatively coupled to or include a database 42 structured to store, e.g., without limitation, customer data including, e.g., without limitation, measured changes in line voltages and frequencies, powerline event or anomaly data, power usage data and historical data associated with a particular customer of a power management service provider. The power management service cloud 40 is also communicatively coupled to the utility provider 10, the SEHM 100 and an energy monitoring application 51. The energy monitoring application 51 may be installed in a mobile user device (e.g., without limitation, smart phones, smart tablet, or other mobile smart devices) 50*a-n*. The SEHM 100 transmits data including, e.g., without limitation, the measured changes in line voltage and frequencies, device IDs, user information or geolocation information to the power management service cloud 40. Upon receiving the data, the power management service cloud 40 analyzes the data based at least in part on historical data including past powerline events, powerline related anomalies or activity logs stored in the database 42. The cloud 40 updates the database 42 based on the data and analysis results. The data analysis or determination of powerline events or anomalies may trigger automatic and/or manual actions. Automatic actions include, e.g., without limitation, termination of power supply to critical or sensitive equipment in a building structure 20*a-n* by controlling a smart circuit interrupter or devices remotely connected thereto by the user via the energy monitoring application 51. Further, the power management service cloud 40 may automatically transmit a notice to the utility provider 10 of geographical power events. For example, if a plurality of SEHMs 100 in a same geolocation 15 are transmitting data including similar events, the data may suggest a faulty transformer. Upon receiving a user approval, the utility provider 10 may dispatch a field technician 54 to inspect and diagnose the transformer 11 based on the notice. The utility provider 10 may transmit the automatic actions taken to the cloud 40. Manual actions may be performed by the user based on the notification. The user may review the notification, inspect the data, view real time status of powerlines 12, and review historic performance and events of corresponding, e.g., without limitation, power distribution system 30*a-n* via the energy monitoring application 51. The notification may include status of attached surge protection device (SPD) 130, recommended actions (e.g., without limitation, replacement of the SPD) and the automatic actions taken by the cloud 40 or SEHM 100 based on the data. Based on the notification, the user may reach out to a field technician (e.g., a field personnel 44 in FIG. 2) who can turn off the power to critical or sensitive equipment, determine if an SPD 130 within the SEHM 100 needs to be replaced and/or perform appropriate maintenance or repairs. Optionally, the user may contact the certified contractor network 53 and request support.

Figure 3:
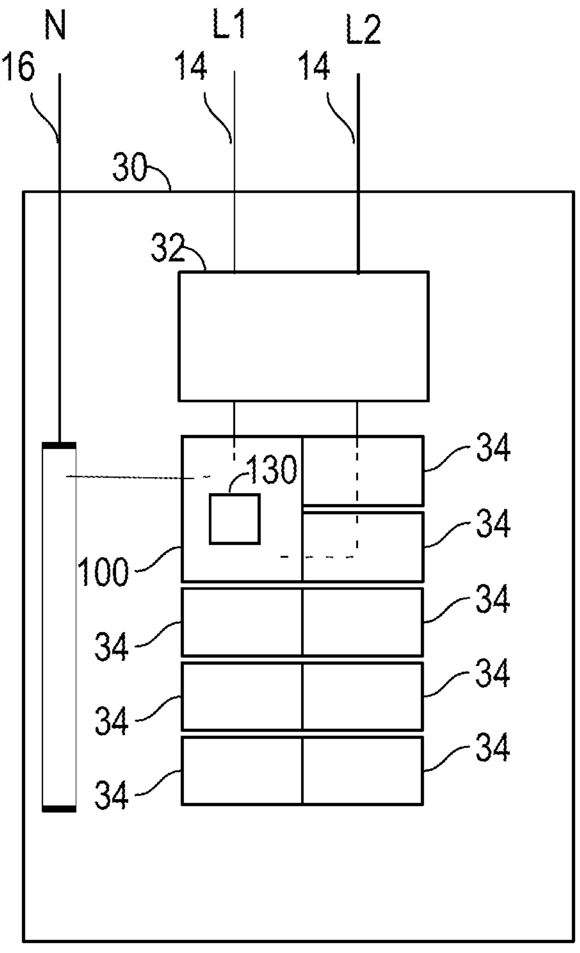
FIG. 3 is a block diagram of a power distribution system including an exemplary smart powerline event and health monitoring device in accordance with an example embodiment of the disclosed concept.

FIG. 3 is a block diagram of a power distribution system 30 including an exemplary smart powerline event and health monitoring device (SEHM) 100 in accordance with an example embodiment of the disclosed concept. A power distribution system 30 includes LINE conductors 14, a NEUTRAL conductor 16 and a ground (not shown) and is structured to distribute power to associated loads via the LINE conductors 14. It is connected to the power source 11 at the LINE conductors 14 and distributes power from the utility provider 10. It also includes a main circuit interrupter 32, a plurality of branch circuit interrupters 34 that are connected to respective loads and the SEHM 100. The main circuit interrupter 32 is connected to the LINE conductors 14 and feeds power to the branch circuit interrupters 34. The LINE conductors 14 and the NEUTRAL conductor 16 are connected to the SEHM 100 structured to monitor powerline event and health based at least in part on changes in line voltages and frequencies and/or status of the SPD 130.

Figure 4:
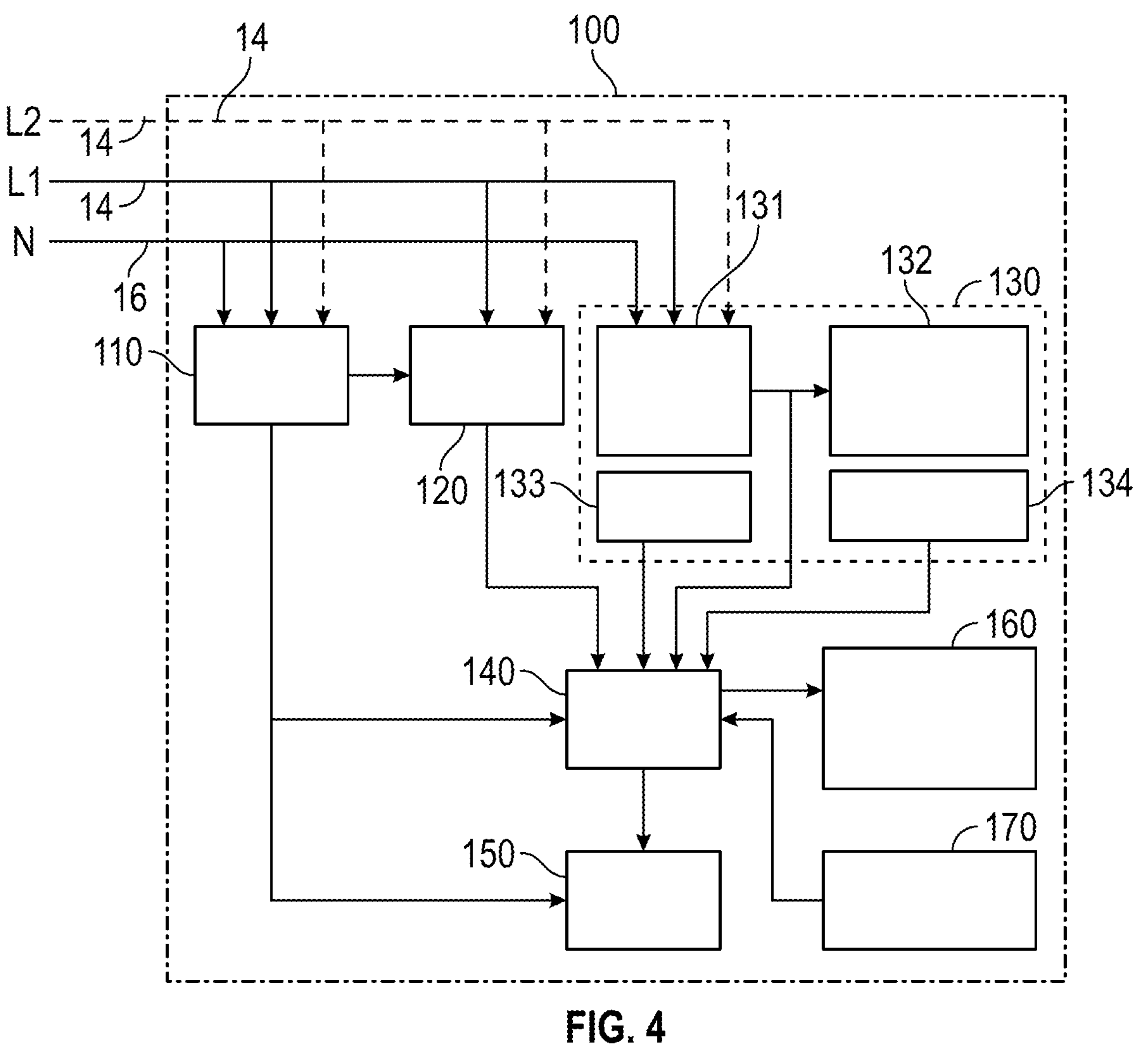
FIG. 4 is a block diagram of an exemplary smart powerline event and health monitoring device in accordance with the disclosed concept

FIG. 4 illustrates a block diagram of a smart powerline event and health monitoring device (SEHM) 100 in accordance with the disclosed concept. The SEHM 100 is structured to be installed in the power distribution system 30*a-n* and electrically connected between LINE conductors 14 and NEUTRAL conductor 16 or ground conductor (not shown). It includes a power supply 110, a voltage measurement device 120, a surge protection device (SPD) 130, a controller 140, a communication module, a network status indicator 160 and a reset button 170. The power supply 110 is electrically connected to the conductors 14, 16 and supplies low DC power to the electrical components of the SEHM 100. A voltage measurement device 120 is electrically connected to the LINE conductors 14 and structured to measure changes in line voltages and frequencies and transmit the measured changes to the controller 140. It may be any type of a voltage sensor suitable for measuring the instantaneous changes in line voltages and frequencies.

Figure 5:
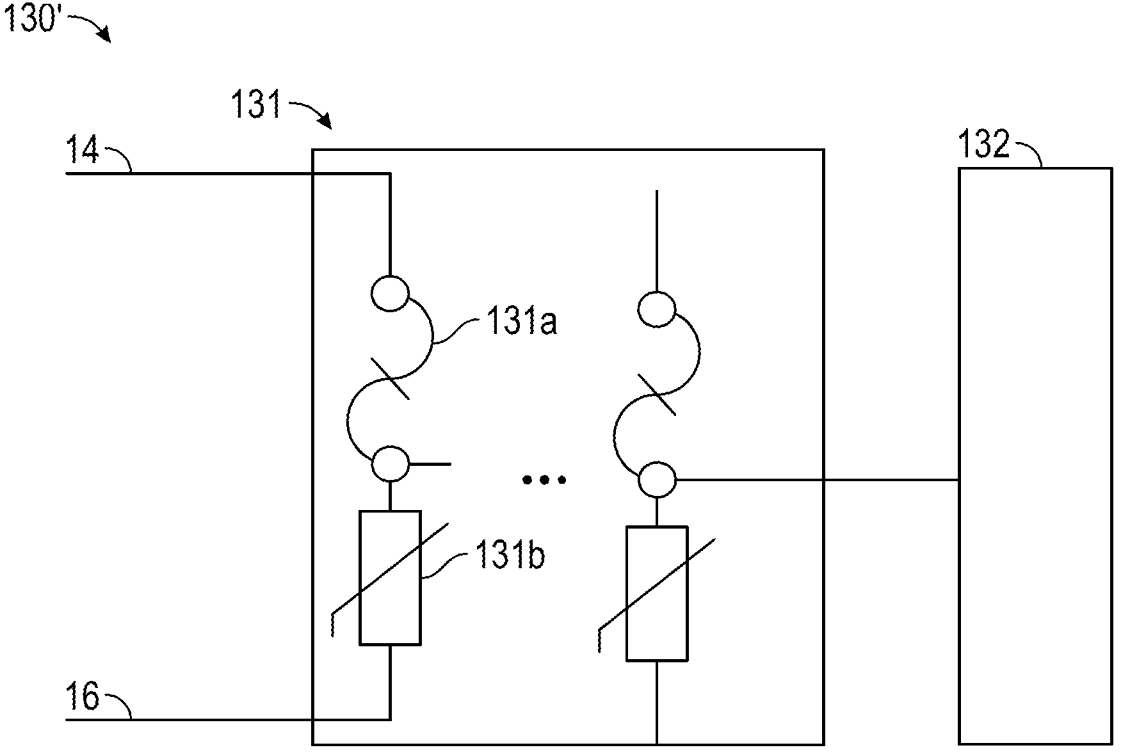
FIG. 5 is a block diagram of an exemplary surge protection device in accordance with the disclosed concept.

The SPD 130 is connected to the LINE conductors 14 and the NEUTRAL conductor 16 and is structured to shunt electrical energy from a voltage surge to the ground or NEUTRAL conductor 16. The SPD 130 or a component thereof may be replaceable. The SPD 130 includes surge protectors (e.g., without limitation, metal oxide varistors (MOVs) 131*b* coupled to thermal fuse elements 131*a* as shown in FIG. 5) and an SPD status indicator 132 connected to the surge protectors. As shown in FIG. 5, the SPD 130' may include surge protectors 131 and an SPD indicator 132. The surge protectors 131 may include a set of MOVs 131*b* each coupled to thermal fuse elements 131*a* in series at one end. The MOVs 131*b* are connected to the NEUTRAL conductor at the other end. The thermal fuse elements 131*a* are electrically connected to the LINE conductors 14 at one end and to the SPD status indicator 132 at the other end. The SPD status indicator 132 may be, a plurality of LEDs, LCD or other suitable SPD status indicator and is structured to indicate real time, instantaneous status of the SPD 130. For example, a plurality of LEDs 132 may be lit to indicate that the SPDs 130, 130' connected to corresponding powerlines are active, i.e., in a healthy operating condition. When the LEDs 132 are turned OFF, it indicates that SPD 130, 130' connected to the corresponding powerlines are inactive, i.e., a loss of the surge protection. It will be understood that the LED provides a physical indication of the SPD status on site while the user can view the real time SPD status via the energy monitoring application 51 at any time at any place. Optionally, the SPD 130 may include a counterfeit device monitor 133 structured to provide information for the devices permitted to be installed within the SPD 130. Optionally, the SPD 130 may also include an SPD module identifier 134 structured to provide an SPD ID such that any future replacement of the SPD 130 can be performed accurately and expeditiously. The counterfeit device monitor 133 and/or the SPD module identifier 134 may be provided as labels disposed on an external surface of the SPD 130 and/or viewed in the energy monitoring application 51.

The controller 140 may be a processing unit including a processor and a memory. The processor may be, for example and without limitation, a microprocessor, a microcontroller, or some other suitable processing device or circuitry. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. The memory may store, e.g., without limitation, the data received from the voltage measurement device 120, the historical data, customer information, device information, an event or activity log, etc. The controller 140 is structured to receive the measured changes in line voltages and frequencies from the voltage measurement device 120 and transmit data including the measured changes to the cloud 40. The data may also include, e.g., without limitation, device IDs, user information or geolocation information. In some examples, the controller 140 may analyze the measured changes and determine if a powerline event or anomaly has occurred or is about to occur. In some examples, the controller 140 may directly transmit a notification to the mobile user device 50*a-n* based at least in part on detected SPD status and/or the powerline event and health analysis performed by itself.

The communication module 150 may be Wi-Fi or Bluetooth® low energy (BLE) protocol compliant. It is structured to receive and transmit the data between the controller 140 and the cloud 40 or the notification and/or the data between the controller 140 and the mobile user devices 51*a-n* via a wireless connection, e.g., without limitation, a Wi-Fi connection. The network status indicator 160 is connected to the controller 140 and structured to indicate the network connection status of the SEHM 100. That is, the network status indicator 160 indicates connection or disconnection status of the SEHM 100 to the cloud and/or the mobile user device via the wireless connection. While the network status indicator 160 provides a physical indication of the network connection status of the SEHM 100, the user may view the network connection status via the energy monitoring application 51 and connect or disconnect the wireless connection. The reset button 170 may be any type of switches structured to be actuated to reset the network connection, e.g., without limitation, Wi-Fi connection or to the device factory setting.

In operation, the voltage measurement device 120 measures changes in line voltages and frequencies and transmits the measured changes to the controller 140. The controller 140 in turn transmits the data including the measured changes to the power management service cloud 40 via the communication module 150 in a wired or wireless connection (e.g., without limitation, Internet, Wi-Fi connection). In some examples, the controller 140 also is capable of analyzing the data and transmit a notification to the mobile user device 50*a-n* directly. Upon receiving the data, the power management service cloud 40 analyzes the data based at least in part on the historical data, determines that a powerline event has occurred, and transmits a notification to a corresponding mobile user device 50*a-n* in response to the determination, the notification including, e.g., without limitation, the data, status of attached surge protection device (SPD) 130, recommended actions (e.g., without limitation, replacement of the SPD 130 or a component thereof) and the automatic actions taken by the utility provider 10 or the SEHM 100. Upon receiving the notification, the user may take preventive or remedial actions such as contacting a field technician 44 for inspection and/or repair of the SPD 130 or a component thereof. Further, in an event of a power source failure (e.g., without limitation, a faulty transformer 11), the utility provider 10 may contact impacted users and request permissions to perform automatic inspection of the common power source 11 and/or affected areas, or conduct maintenance, replacement and/or repair of the faulty transformer.

Accordingly, the SEHM 100 according to the disclosed concept not only provides real time detection of powerline events or anomalies, but also provides capabilities and benefits that are not provided by the conventional surge protection devices. For example, the SEHM 100 continuously monitors and logs voltages, frequencies, surge events and other power line related anomalies, thereby allowing the user to review at any time the current and past data of power line events and overall powerline health that have been logged by the SEHM 100. By promptly notifying the user of any powerline events or anomalies that are currently occurring or about to occur via the mobile user device 50*a-n* (e.g., without limitation, via the energy monitoring application 51, e-mail or SMS) in a wireless connection, the SEHM 100 allows the user to timely take appropriate actions (e.g., without limitation, ordering a replacement of the SPD 130 or components thereof, contacting a field technician, contacting the certified contractor network 53, etc.) based on the notification. The notification includes analysis results based on the current and historical powerline data using the processing power of the cloud 40. This is useful in that the powerline data including the measured changes in line voltages and frequencies can be analyzed with a more powerful processing power of the cloud 40, rather than being limited to the processing power of the controller 140. The more powerful processing power of the cloud 40 allows for a more reliable, accurate and efficient analysis and determination of the powerline event and health status in real time. Further, by storing and constantly updating the database 42, the SEHM 100 allows a field technician to better understand the history of powerline events and assist the field technician to identify a potential issue. Additionally, the SEHM 100 may directly alert the user of any detected powerline events or anomalies and analysis results received from the cloud 40 via the communication module 150 via a wireless connection, thereby ensuring that the user is notified of any detected power line events or anomalies even if the connection between the cloud 40 and the mobile user device 50*a-n* has failed or lost. Finally, since the building structures 20*a-n* are clustered in the same geographical area using the same power source 11, each SEHM 100 transmits data including measured line voltages and frequencies, powerline events or anomalies related to the same power source 11. The cloud 40 can therefore combine the data of all of the SEHMs 100 within the geographical area, analyze the combined data, determine that a powerline event or anomaly associated with the common power source 11 (e.g., a faulty transformer) has occurred or is about to occur based on the analysis, and notify the utility provider 10 to dispatch a field technician 54 to perform inspection of the transformer 11 before a powerline event of a larger magnitude takes place. Such prediction and preemption of a future power source failure in a geographic area has not been provided by the conventional surge protection devices. In fact, such prediction of the future powerline events or anomalies based at least in part SPD status has not been offered by the conventional surge protection devices. Indeed, the conventional surge protection devices do not include voltage measurement devices 120 for monitoring powerline event and health. Thus, the SEHM 100 provides the capabilities and benefits that are novel and unavailable with the conventional surge protection devices.

FIG. 6 is a flow chart of a method 600 of smart powerline event and health monitoring in a power distribution system in accordance with a non-limiting, example embodiment of the disclosed concept. The method 600 may be performed by the smart powerline event and health monitoring device (SEHM) 100 of FIGS. 1-5 or any components thereof.

At 610, an SEHM is provided within a power distribution system, the SEHM including a voltage measurement device connected to line conductors and structured to measure changes in line voltages and frequencies; the SPD connected to the line conductors and the neutral conductor and structured to shunt electrical energy from a voltage surge to the neutral conductor; a controller connected to the voltage measurement device and the SPD and structured to receive the measured changes from the voltage measurement device; and a communication module connected to the controller, the communication module being communicatively coupled to a cloud and a mobile user device having an energy monitoring application installed therein, the communication module being structured to receive the data including the measured changes from the controller and transmit the data to the cloud.

At 620, the voltage measurement device measures real time changes in line voltages and frequencies and transmit the measured changes to the controller of the SEHM.

At 630, the controller receives the measured changes from the voltage measurement device and transmits data including the measured changes to the cloud in a wired or wireless connection.

At 640, the cloud receives the data, analyze the data based at least in part on historical data including past powerline events, powerline related anomalies or activity logs, determine that a powerline event or anomaly has occurred or is about to occur based on the analysis, and transmit a notification to a mobile user device via a wireless connection.

At 650, the mobile user device receives the notification from the cloud.

At 660, the user performs a preventative or remedial action based on the notification.

FIG. 7 is a flow chart for a method 700 of smart powerline event and health monitoring in a power distribution system included in a geographical area having a common power source in accordance with the disclosed concept. The method 700 may be performed by the smart powerline event and health monitoring device (SEHM) 100 of FIGS. 1-5 or any components thereof.

At 710, an SEHM is provided within a power distribution system included in a utility system for a geographic area having a common power source, the SEHM including a voltage measurement device connected to line conductors and structured to measure changes in line voltages and frequencies; the SPD connected to the line conductors and the neutral conductor and structured to shunt electrical energy from a voltage surge to the neutral conductor; a controller connected to the voltage measurement device and the SPD and structured to receive the measured changes from the voltage measurement device; and a communication module connected to the controller, the communication module being communicatively coupled to a cloud and a mobile user device having an energy monitoring application installed therein, the communication module being structured to receive the data including the measured changes from the controller and transmit the data to the cloud. The data include the measured changes, device IDs, user information or geolocation information of the utility system. The historical data include past powerline events, powerline related anomalies or an activity log.

At 720, the voltage measurement device measures real time changes in line voltages and frequencies and transmit the measured changes to the controller of the SEHM.

At 740, the cloud receives the data and combines the data with data received from other SEHMs associated with respective other building structures located within the geographical area.

At 750, the cloud analyzes the combined data based at least in part on the historical data of all of the SEHMs and determines that a powerline event or anomaly associated with the common power source has occurred or is about to occur based on the analysis.

At 760, the cloud transmits a notice to a utility provider in response to the determination via the wireless connection, the notification including the combined data, the analysis and the determination.

At 770, the utility provider performs automatic actions based on the notice and transmits information including the automatic actions taken by the utility provider to the cloud.

At 780, the cloud transmits a notification to a mobile user device via a wireless connection, the notice including the powerline event or anomaly associated with the common power source, automatic actions taken by the utility provider and/or the SEHMs, and/or a recommended action. The automatic actions taken by the utility may include, e.g., without limitation, dispatching a field technician to inspect the common power source and associated areas, determining power source failure or anomaly, and performing repair or replacement of the common power source or components thereof. The automatic actions taken by the SEHMs may include automatic interruption of current flowing to critical or sensitive loads via corresponding circuit interrupters disposed in the power distribution systems. Upon receiving the notification, the user may perform a preventative or remedial action based on the recommended action.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A smart powerline event and health monitoring device (SEHM) structured to be disposed in a power distribution system for a building structure located in a utility system, the SEHM comprising:

a voltage measurement device connected to line conductors and structured to measure changes in line voltages and frequencies;

a surge protection device (SPD) connected to the line conductors and a neutral conductor and structured to shunt electrical energy from a voltage surge to the neutral conductor;

a controller connected to the voltage measurement device and the SPD and structured to receive the measured changes from the voltage measurement device; and a communication module connected to the controller, the communication module being communicatively coupled to a cloud and a mobile user device having an energy monitoring application installed therein, the communication module being structured to receive the data including the measured changes from the controller and transmit the data to the cloud, wherein the cloud includes or is communicatively coupled to a database structured to store the data and historical data including past powerline events, powerline related anomalies or activity logs associated with the SEHM.

2. The SEHM of claim 1, wherein the SPD includes a plurality of surge protectors and an SPD status indicator connected to the plurality of surge protectors, the line conductors and the neutral conductor, the SPD status indicator being structured to indicate SPD status for a corresponding powerline.

3. The SEHM of claim 2, wherein the SPD status indicator comprises a plurality of LEDs each connected to corresponding line conductors and wherein when an LED is lit, the corresponding powerline is healthy and the respective SPD is active, and wherein when the LED is turned OFF, the corresponding powerline is not healthy and the respective SPD is inactive or lost.

4. The SEHM of claim 1, wherein the data include the measured changes, device IDs, user information or geolocation information associated with the building structure.

5. The SEHM of claim 1, wherein the cloud is structured to receive the data, analyze the data based at least in part on historical data including past powerline events, powerline related anomalies or activity logs, determine that a powerline event or anomaly has occurred or is about to occur, and transmit a notification to the mobile user device in response to the determination in a wireless connection.

6. The SEHM of claim 5, wherein the notification includes the data, analysis results, a recommended action and automatic actions taken in response to the determination.

7. The SEHM of claim 6, wherein the power distribution system includes a plurality of circuit interrupters structured to interrupt current flowing to respective loads, and wherein the recommended action comprises ordering a replacement SPD or SPD component, interrupting current flowing to critical loads via respective circuit interrupters, contacting a field technician for inspection and/or maintenance of the SPD, or contacting a certified contractor network.

8. The SEHM of claim 6, wherein the automatic actions include automatically interrupting current flowing to critical or sensitive loads via respective circuit interrupters by the SEHM based on the determination.

9. The SEHM of claim 6, wherein the cloud is further structured to combine the data with data received from a plurality of other SEHMs associated with other building structures located in a same geographical area having a common power source, analyze the combined data based at least in part on historical data of all of the SEHMs and determine that a powerline event or anomaly associated with the common power source has occurred or is about to occur based on the analysis.

10. The SEHM of claim 9, wherein the cloud transmits a notice to a utility provider associated with the common power source based on the determination, the notice including the combined analysis results, and wherein the automatic actions include dispatching, by the utility provider, a field technician for inspection and/or repair of the common power source.

11. The SEHM of claim 1, wherein the controller is further structured to directly transmit a notification to the mobile user device including the energy monitoring application, the mobile user device being communicatively coupled to the cloud, the notification including the data, a recommended action and automatic actions taken by the SEHM or the cloud.

12. The SEHM of claim 11, wherein the SPD includes an SPD indicator structured to indicate SPD status and a plurality of metal oxide varistors (MOVs) each connected in series with respective thermal fuse elements connected to the SPD indicator, the line conductors and the neutral conductor, and wherein the controller is further structured to directly transmit the notification to the mobile user device, the notification including the SPD status and a recommended action based at least in part on the SPD status.

13. A utility system, comprising:

a power source having powerlines;

a plurality of building structures each including respective power distribution systems having a smart powerline event and health monitoring device (SEHM) electrically connected to the powerlines and structured to monitor powerline event and health based at least in part on changes in line voltages and frequencies and/or a status of a surge protection device (SPD), the SEHM comprising: a voltage measurement device connected to line conductors and structured to measure changes in line voltages and frequencies; the SPD connected to the line conductors and the neutral conductor and structured to shunt electrical energy from a voltage surge to the neutral conductor; a controller connected to the voltage measurement device and the SPD and structured to receive the measured changes from the voltage measurement device; and a communication module connected to the controller, the communication module being communicatively coupled to a cloud and a mobile user device having an energy monitoring application installed therein, the communication module being structured to receive the data including the measured changes from the controller and transmit the data to the cloud;

a mobile user device including an energy monitoring application installed therein; and a power management service cloud communicatively coupled to the communication module of the SEHM and the mobile user device, wherein the communication module is structured to receive the data including the measured changes from the controller and transmit the data to the cloud, wherein the cloud includes or is communicatively coupled to a database structured to store the data and historical data including past powerline events, powerline related anomalies or activity logs associated with the SEHM.

14. A method of providing smart powerline event and health monitoring in a utility system having a power distribution system associated with respective building structure, the method comprising:

providing a smart powerline event and health monitoring device (SEHM) within a power distribution system, the SEHM including a voltage measurement device connected to line conductors and structured to measure changes in line voltages and frequencies; the SPD connected to the line conductors and the neutral conductor and structured to shunt electrical energy from a voltage surge to the neutral conductor; a controller connected to the voltage measurement device and the SPD and structured to receive the measured changes from the voltage measurement device; and a communication module connected to the controller, the communication module being communicatively coupled to a cloud and a mobile user device having an energy monitoring application installed therein, the communication module being structured to receive the data including the measured changes from the controller and transmit the data to the cloud;

measuring, by the voltage measurement device, real time changes in line voltages and frequencies and transmitting the measured changes to the controller;

receiving and transmitting, by the controller, data including the measured changes to the cloud;

analyzing, by the cloud, the data based at least in part on the historical data;

determining, by the cloud, that a powerline event or anomaly has occurred or is about to occur based on the analysis;

transmitting, by the cloud, a notification to the mobile user device via a wireless connection; and performing a preventive or remedial action based on the notification.

15. The method of claim 14, wherein the utility system includes a plurality of other building structures disposed in a geographical area having a common power source, the method further comprising:

combining, by the cloud, the data and data received from other SEHMs associated with the other building structures;

analyzing, by the cloud, combined data including measured changes in line voltages and frequencies associated with respective building structures;

determining, by the cloud, that a powerline event or anomaly associated with the common power source has occurred or is about to occur based on the analysis;

transmitting, by the cloud, to a utility provider, a notice including the determination; and performing, by the utility provider, an automatic action in response to the notice.

16. The method of claim 15, further comprising:

transmitting, by the utility provider, to the cloud the automatic action taken by the utility provider; and transmitting, by the cloud, the notification to the mobile user device, the notification including the powerline event or anomaly associated with the common power source, automatic actions taken by the utility provider and/or the SEHM and/or a recommended action.

17. The method of claim 16, further comprising:

performing, by the user, a preventative or remedial action based on the notification.

18. The method of claim 14, further comprising:

indicating, by the SPD status indicator, SPD status; and/or transmitting, by the controller, the notification including the SPD status to the mobile user device via a wireless connection.

19. The method of claim 18, further comprising:

providing a network connection status of the SEHM to the mobile user device, the network connection status including connection or disconnection status of the SEHM to the cloud and/or the mobile user device via the wireless connection.

* * * * *